(12) United States Patent
Eiswerth et al.

(10) Patent No.: US 11,239,835 B2
(45) Date of Patent: Feb. 1, 2022

(54) INTEGRATED DUPLEX DEPLOYMENT FUNCTION WITH SAFETY DIAGNOSTICS FOR RESTRAINT CONTROL MODULE

(71) Applicant: VEONEER US, INC., Southfield, MI (US)

(72) Inventors: David Eiswerth, Wixom, MI (US); Vincent Colarossi, Dearborn Heights, MI (US); Marco Liedtke, Dortmund (DE); Wolfram Budde, Castrop-Rauxel (DE)

(73) Assignee: VEONEER US, INC., Southfield, MI (US)

( * ) Notice: Subject to any disclaimer, the term of this patent is extended or adjusted under 35 U.S.C. 154(b) by 152 days.

(21) Appl. No.: 16/512,917

(22) Filed: Jul. 16, 2019

(65) Prior Publication Data
US 2021/0016734 A1    Jan. 21, 2021

(51) Int. Cl.
| | |
|---|---|
| *H03K 17/00* | (2006.01) |
| *H03K 17/687* | (2006.01) |
| *H03K 17/74* | (2006.01) |
| *F42D 1/05* | (2006.01) |
| *B60R 21/017* | (2006.01) |
| *B60R 21/26* | (2011.01) |

(52) U.S. Cl.
CPC ............... *H03K 17/00* (2013.01); *F42D 1/05* (2013.01); *H03K 17/6871* (2013.01); *H03K 17/74* (2013.01); *B60R 21/017* (2013.01); *B60R 21/26* (2013.01); *B60R 2021/26029* (2013.01)

(58) Field of Classification Search
CPC .... H03K 17/00; H03K 17/6871; H03K 17/74; F42D 1/05; B60R 21/017; B60R 21/26; B60R 2021/26029
USPC ........................................................ 361/247
See application file for complete search history.

(56) References Cited

U.S. PATENT DOCUMENTS

| | | | | |
|---|---|---|---|---|
| 6,012,736 A | * | 1/2000 | Hansen | B60R 21/01 280/731 |
| 2019/0190249 A1 | * | 6/2019 | Colarossi | H02H 3/305 |
| 2019/0299894 A1 | * | 10/2019 | Colarossi | B60R 21/0173 |
| 2019/0302162 A1 | * | 10/2019 | Colarossi | G01R 19/04 |
| 2020/0130624 A1 | * | 4/2020 | Colarossi | H03K 17/60 |

* cited by examiner

*Primary Examiner* — Yemane Mehari
(74) *Attorney, Agent, or Firm* — Dickinson Wright PLLC

(57) ABSTRACT

An active power blocking circuit in series with a squib. The active power blocking circuit may include a logic circuit, a first switch, a second switch, and an amplifier. The first switch may have a first side connected to a positive connection and a second side connected to a negative connection. The second switch may have a first side connected to the positive connection and a second side connected to the negative connection through a diode. The amplifier may be connected the second side of the second switch and the output of the amplifier may be connected to the logic circuit.

21 Claims, 4 Drawing Sheets

INTEGRATED DUPLEX DEPLOYMENT FUNCTION WITH SAFETY DIAGNOSTICS FOR RESTRAINT CONTROL MODULE

FIELD OF THE DISCLOSURE

The disclosed system and method is related to a duplex deployment module with safety diagnostics for a restraint control module.

BACKGROUND

Duplex Firing involves the use of a single wire pair to connect two squibs to the Restraints ECU, eliminating two wires and associated connectors in the vehicle. In this Integrated Duplex Firing concept, two wires and associated connectors in the vehicle can be eliminated to support every two squibs. A restriction in this Integrated Duplex Firing concept is that the squibs connected in Duplex Firing configuration cannot be deployed simultaneously. In the initiator design integrated blocking circuits are included in the firing path, enabling the use of bidirectional firing current to independently control deployment at each squib.

BRIEF SUMMARY

An active power blocking circuit is disclosed for use with a squib. The active power blocking circuit may include a logic circuit, a first switch, a second switch, third switch, a first amplifier and second amplifier. The first switch may have a first side connected to a positive connection and a second side connected to a negative connection. The second switch may have a first side connected to the positive connection and a second side connected to the negative connection through a diode. The third switch may have a first side connected to the positive connection and a second side connected to the negative connection through a diode. The first amplifier may have its positive input connected the second side of the third switch and negative input connected to an internal reference voltage, and the output of the amplifier may be connected to the logic circuit. The second amplifier may have its negative input connected the squib monitoring and positive input connected to an internal reference voltage and the output of the amplifier may be connected to the logic circuit.

Benefits of the implementation may include an integrated solution to support duplex firing capability, a digital state machine may provide deployment and safety diagnostics capability. The implementation may include a multiple switch function for the power blocking concept. A silicon on insulator (SOI) process may provide the required voltage isolation.

DETAILED DESCRIPTION OF THE DRAWINGS AND THE PRESENTLY PREFERRED EMBODIMENTS

Figure 1:
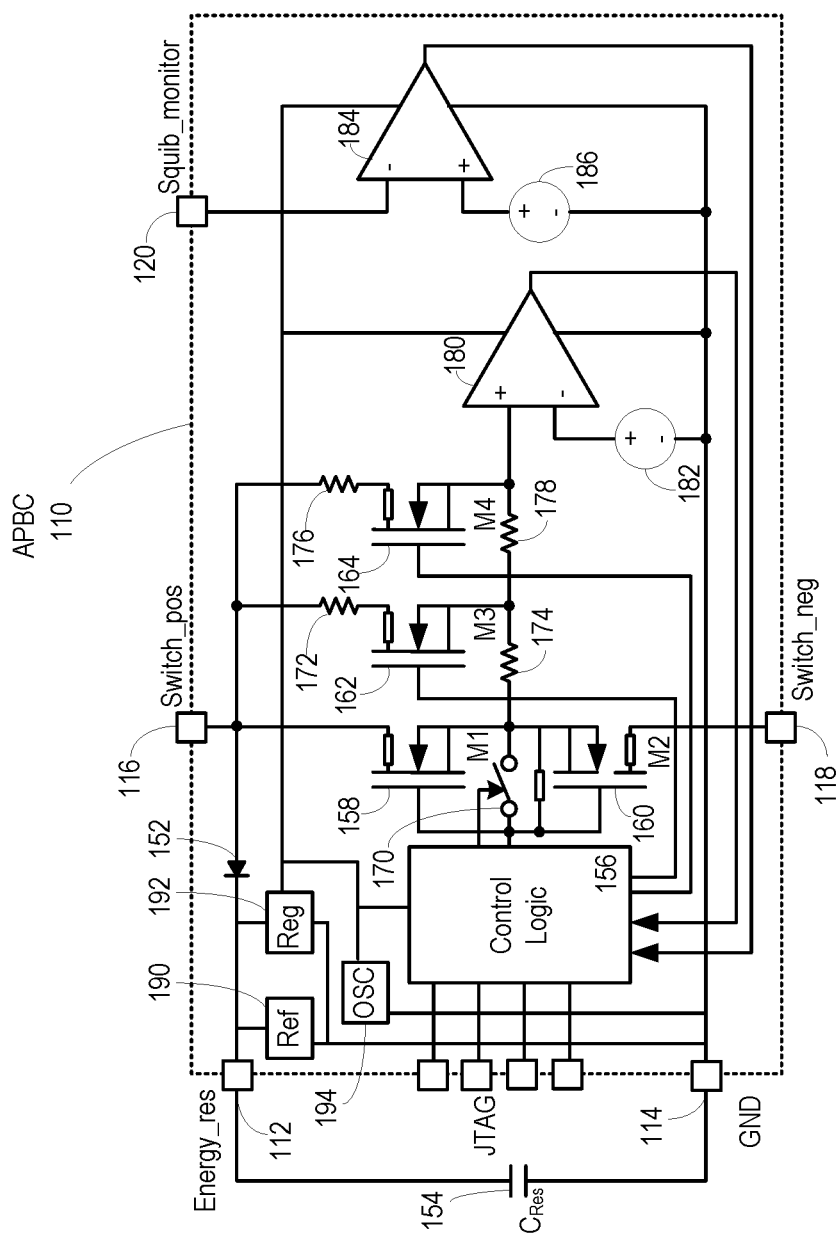
FIG. 1 is a schematic view of an integrated duplex deployment circuit within a restraint module with safety diagnostics.

FIG. 1 is a schematic view of an integrated duplex deployment circuit within a restraint module with safety diagnostics. The Active Power Blocking Circuit 110 (APBC) may be integrated onto an ASIC. The APBC 110 may contain five functional pins: Energy Reserve (112), Gnd (114), Switch Positive (116), Switch Negative (118), Squib Monitor (120).

Diagnostic current may be provided to the switch positive 116 (e.g. positive connection) and returned through the switch negative 118 (e.g. negative connection). Current may flow though diode 152 to the energy reserve terminal 112. A capacitor 154 may be connected between the energy reserve terminal 112 and a ground terminal 114. The capacitor 154 stores charge that can be used to power the entire APBC 110. Ref circuit 190 and regulator circuit 192 may pull power from high side of the capacitor 154 and be connected to ground as a return. Similarly, oscillator circuit 194 the control logic 156 may pull power from the regulator circuit 192 and be connected to ground as a return.

Transistor 158 (M1) and transistor 160 (M2) may be connected in series to operate together as a single switch. Transistor 158 (M1) and transistor 160 (M2) may have internal body diodes oriented in opposite directions for current blocking when M1 and M2 are in the off state. Transistor 158 (M1) and transistor 160 (M2) may be n-channel MOSFETs. In some implementations, a drain of transistor 158 (M1) may be connected to the switch positive terminal 116, a source of transistor 158 (M1) may be connected to a source of transistor 160 (M2), and a drain of transistor 160 (M2) may be connected to the switch negative terminal 118. The gates of transistor 158 (M1) and transistor 160 (M2) may be controlled by the control logic 156. The gate of transistor 158 (M1) may be connected to the gate of transistor 160 (M2) so that they are controlled together. Further, a switch 170 may be connected between the gate and source connections of transistor 158 (M1) and transistor 160 (M2) to further control the off state of M1 and M2.

Transistor 162 (M3) is controlled separately by the control logic 156. As such, the control logic 156 may be connected to the gate of transistor 162 (M3). In some implementations, a drain of transistor 162 (M3) may be connected to the switch positive terminal 116 through resistor 172. A source of transistor 162 (M3) may be connected to switch negative through resistor 174 and transistor 160 (M2). As such, a source of transistor 162 (M3) may be connected to a source of transistor 160 (M2) and a drain of transistor 160 (M2) may be connected to the switch negative terminal 118.

Transistor 164 (M4) is controlled separately by the control logic 156. As such, the control logic 156 may be connected to the gate of transistor 164 (M4). In some implementations, a drain of transistor 164 (M4) may be connected to the switch positive terminal 116 through resistor 176. A source of transistor 164 (M4) may be connected to switch negative through resistor 178, resistor 174, and transistor 160 (M2). As such, a source of transistor 164 (M4) may be connected to a source of transistor 160 (M2) through resistor 178 and resistor 174; and a drain of transistor 160 (M2) may be connected to the switch negative terminal 118.

A first input (e.g. a positive input) of amplifier 180 may be connected to the source of transistor 164 (M4). As such, the first input of amplifier 180 may also be connected to the source of transistor 162 (M3) through resistor 178 and the source of transistor 158 (M1) through resistor 178 and resistor 174. A second input (e.g. a negative input) of the amplifier 180 may be connected to a voltage source 182. This may be used to determine the amount of current provided to the squib circuit (e.g. detect diagnostic or deployment current). The output of amplifier 180 is provided as an input to the control logic 156.

A first input (e.g. a negative input) of amplifier 184 may be connected to the squib monitor terminal 120. Amplifier 184 may be considered a reverse sensing amplifier. A second input (e.g. a positive input) of the amplifier 184 may be connected to a voltage source 186. This may be used to determine if a reverse current is provided to the squib circuit (e.g. whether the other APBC is deploying). The output of amplifier 184 is provided as an input to the control logic 156.

Figure 2:
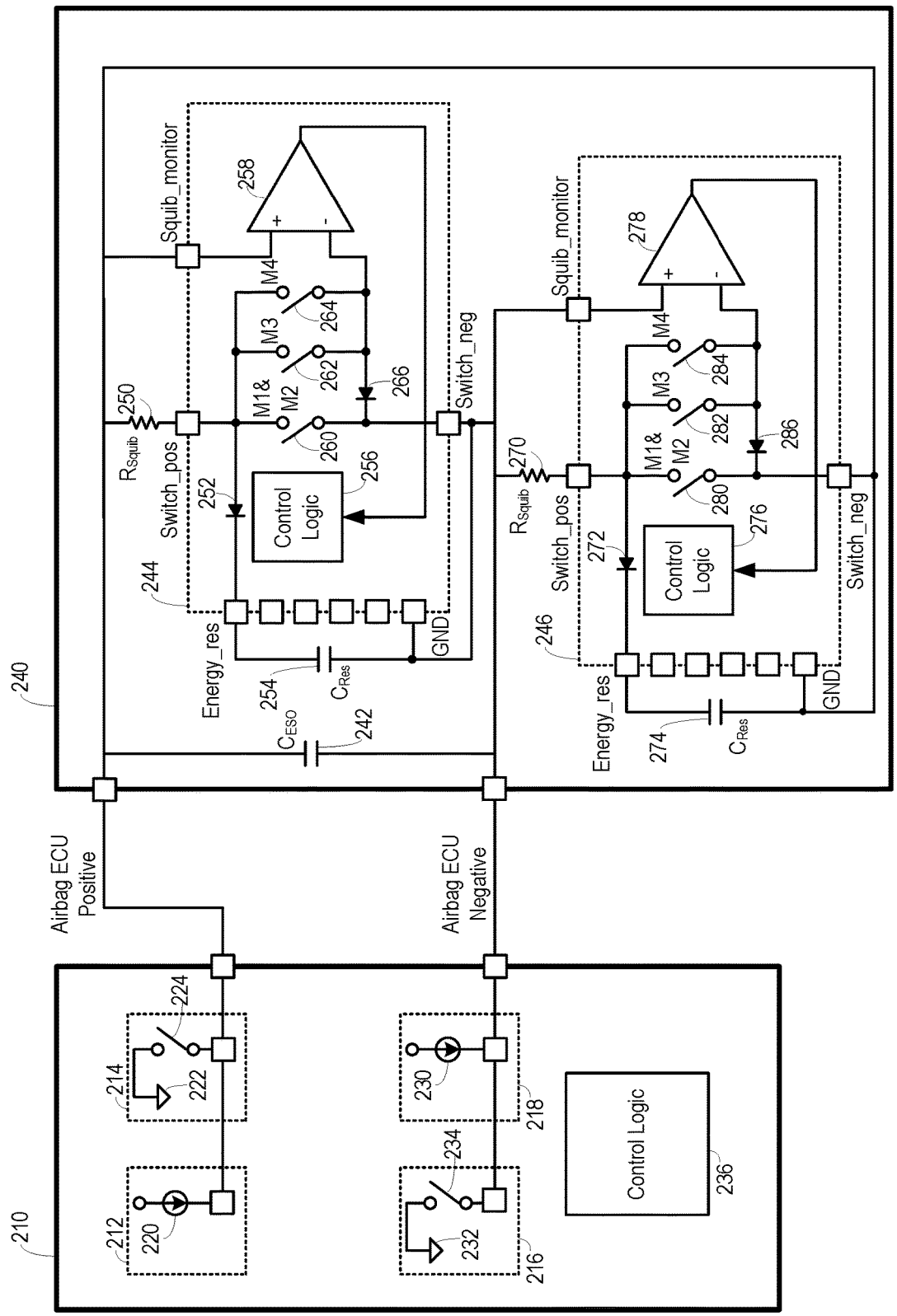
FIG. 2 is a schematic view of an integrated duplex deployment restraint module with safety diagnostics.

FIG. 2 is a schematic view of an integrated duplex deployment restraint module with safety diagnostics. The active power blocking circuit has been simplified in this schematic, however, the implementation described with regard to FIG. 1 is equally applicable for circuit 244 and circuit 246 illustrated in FIG. 2. The restraint control module 210 may communicate with the restraint module 240 through wiring, such as a cable in the vehicle. Using the duplex concept the number of conductors in the cable may be reduced. The restraint control module 210 may include a first current source 220 oriented in a first direction and a second current source 230 oriented in a second direction. However, it is understood that a single current source may be used with switches to reverse the direction. A switch 234 may provide a return path to ground 232 when current is provided by the first current source 220 in the first direction to the restraint module 240 for either diagnostic or deployment purposes. Similarly, a switch 224 may provide a return path to ground 222 when current is provided by the second current source 230 in the second direction to the restraint module 240 for either diagnostic or deployment purposes. Control logic 236 (e.g. a processor or logic circuit) may control the amount and direction of current provided from the restraint control module 210 to the restraint module 240.

The restraint module 240 may include a first loop including a first squib 250 and an active power blocking circuit 244 and a second loop including a second squib 270 and an active power blocking circuit 246. The first loop may be deployable with current provided in the first direction and the second loop may be deployable with current provided in the second direction. A capacitor 242 may be connected between the first squib 250 and the second squib 270 for noise reduction purposes.

A first side of the squib 250 may be connected to the restraint control module 210. A second side of the squib 250 may be connected to the active power blocking circuit 244. Current may flow though diode 252 to a first side of capacitor 254. The second side of capacitor 254 may be connected between the Energy_res pin and GND pin of active power blocking circuit 244. The capacitor 254 stores charge that can be used for powering the logic (e.g. control logic 256) in the active power blocking circuit 244.

A main switch 260 (M1&M2) is connected between the squib 250 and a return for the current. Switch 262 (M3) and Switch 264 (M4) may be connected between the squib 250 and the return through a diode 266. Switch 262 (M3) and switch 264 (M4) may be connected to the anode of diode 266 and the cathode of diode 266 may be connected to the return. This functionality is taken care of by the internal body diode of transistor 160 in FIG. 1. A first input of amplifier 258 (e.g. a negative input) may be connected to the current source. This connection may be used to determine the polarity (e.g. direction) of the current flow. A second input of amplifier 258 may be connected to switch 262 (M3) and switch 264 (M4) opposite squib 250. These connections may be used to determine the amount of current being provided to the squib (e.g. a diagnostic current or a deployment current). The output of amplifier 258 is connected to the control logic 256 for use in controlling the switches 260, 262, and 264.

In general, the ignitor (squib) may be connected between either the airbag ECU positive to Switch Positive of ABPC ASIC 1 (244) or airbag ECU negative to Switch Positive of ABPC ASIC 2 (246). The switches M1,M2,M3,M4 that provide diagnostic or deployment capabilities, may be connected between Switch Positive and Switch Negative of the APBC (244,246). Switches M1 and M2 may be back to back connected power MOSFET switches with body diodes that provide reverse current blocking capability when the switches M1 and M2 are in the off state. M3 and M4 may also be reverse protected switches via the diode connected between their source and Switch Negative connections. An external energy reserve storage capacitor may be connected between Energy Reserve and Gnd pins of the APBC. The APBC ASIC 1 may be powered through the ignitor (Squib) via the airbag ECU positive and ECU negative connections. The APBC ASIC 2 may be powered through the ignitor (Squib) via the airbag ECU negative and ECU positive connections. The Squib Monitor pin of the APBC ASIC 1 may be connected to the airbag ECU positive and the Squib Monitor pin of the APBC ASIC 2 may be connected to the airbag ECU negative. One function of the Squib Monitor pin may be to provide a detection of the reverse firing current in the other APBC. The voltage between the Switch Negative pin and Squib Monitor pins can be sensed. When the voltage between the Switch Negative pin and Squib Monitor pins exceeds an approximate threshold value of 0.100 mA*2 Ohm=0.20V (dc no-fire specification) then the reverse firing current in APBC ASIC2 may be detected. The APBC ASICs can be fabricated on a special silicon on insulator technology that allows the ASIC to be reverse biased in range of voltages required for duplex firing without degradation effects.

The APBC State Diagram may consist of four (4) States. The states may be 1) Startup, 2) Active, 3) Sense1 and 4) Sense2 states.

Startup State provides a switch state (M1,M2,M3,M4 all off) of operation that is high impedance until a known power level is achieved between Energy_Reserve and GND pins to allow proper device operation.

Active State provides a switch state (M1=on, M2=on, M3=off, M4=off) of operation to support either deployment or diagnostic functions. In the active state the Rdson_M1+ Rdson_M2=0.3 ohms. So if deployment is required the resistivity of M1 and M2 is sized to provide the deployment capability. If the deployment ASIC sends diagnostic current, then a low ohmic path (0.3 Ohm) is in serial combination with the deployment loop resistance of some 2 ohms. This can be detected by the deployment loop ASIC during squib resistance value measurements Sense1 State provides a switch state (M1=off, M2=off, M3=on, M4=off) of operation to support deployment or diagnostic functions. If the current in M3>=45 mA then deployment current is detected. Sense1 State is a state required to detect that the active state has been disabled. In this sense1 state the Rdson_M3 with additional internal resistance=10 Ohm. This can be detected by the deployment loop ASIC during squib resistance value measurements.

Sense2 State provides a state of (M1=off, M2=off, M3=off, M4=on) operation to allow diagnostic detection of the deployment current detection comparitor using diagnostic currents. If the current in M4>=30 mA then deployment current is detected via diagnostic current. Sense2 State is a state required to detect that the Sense1 state has been disabled and a switch state that is high ohmic as to not impact deployment is reached. In this sense2 state the Rdson_M4 with additional internal resistance=100 Ohm. This can be detected by the deployment loop ASIC during squib resistance value measurements as an open circuit.

The APBC provides a state machine that provides approx 4 msec in the Active state and Sense1 State as long as the energy reserve voltage(ER)>Start up Threshold. If the energy reserve voltage(ER)<Start up Threshold, then a transition from either the Active state, Sense1 State and the Sense2 to the Startup State will occur.

The ERCharge=1 means that the ER can be charged.

The ERCharge=0 means that the ER Cannot be charged as noted in the Active State. The Switches M1 and M2 provide such a low value of resistance that the APBC ER supply cannot be charged and will run for a limited time based on the charge stored on the ER capacitor connected between Energy Reserve and Gnd.

The APBC may be required to support both diagnostic and deployment functions. The APBC may be running diagnostic procedures and may need to suspend diagnostic procedures to support the deployment function. Neither of these two functions (e.g. diagnostics or deployment) are synchronized. Since there are two separately biased APBC circuits with separated state machines, each APBC may be in a mode of operation that needs to be interrupted to support the other APBC circuit diagnostic or deployment function.

A simplified analysis of the APBC is provided below:

The startup state is required to bring the all switches to an off state when not powered or powering up the APBC. The APBC may be designed to only deploy the ignitor in the Active State, so that is where M1 and M2 switch resistivity is low enough (0.3 Ohm) to allow reliable deployment. Sense1 state and Sense2 states are APBC states that allow diagnosis of not being in the active state. The firing current detection in Sense1 State and Sense2 State allow fast (2 clock cycle transitions) from non-deployment capable states to the deploy capable state which is the Active State. The reverse current detection of APBC ASIC 1 provides a mechanism to disable ongoing APBC ASIC 1 activities and allows the APBC ASIC 2 to provide deployment or vise versa.

Figure 3:
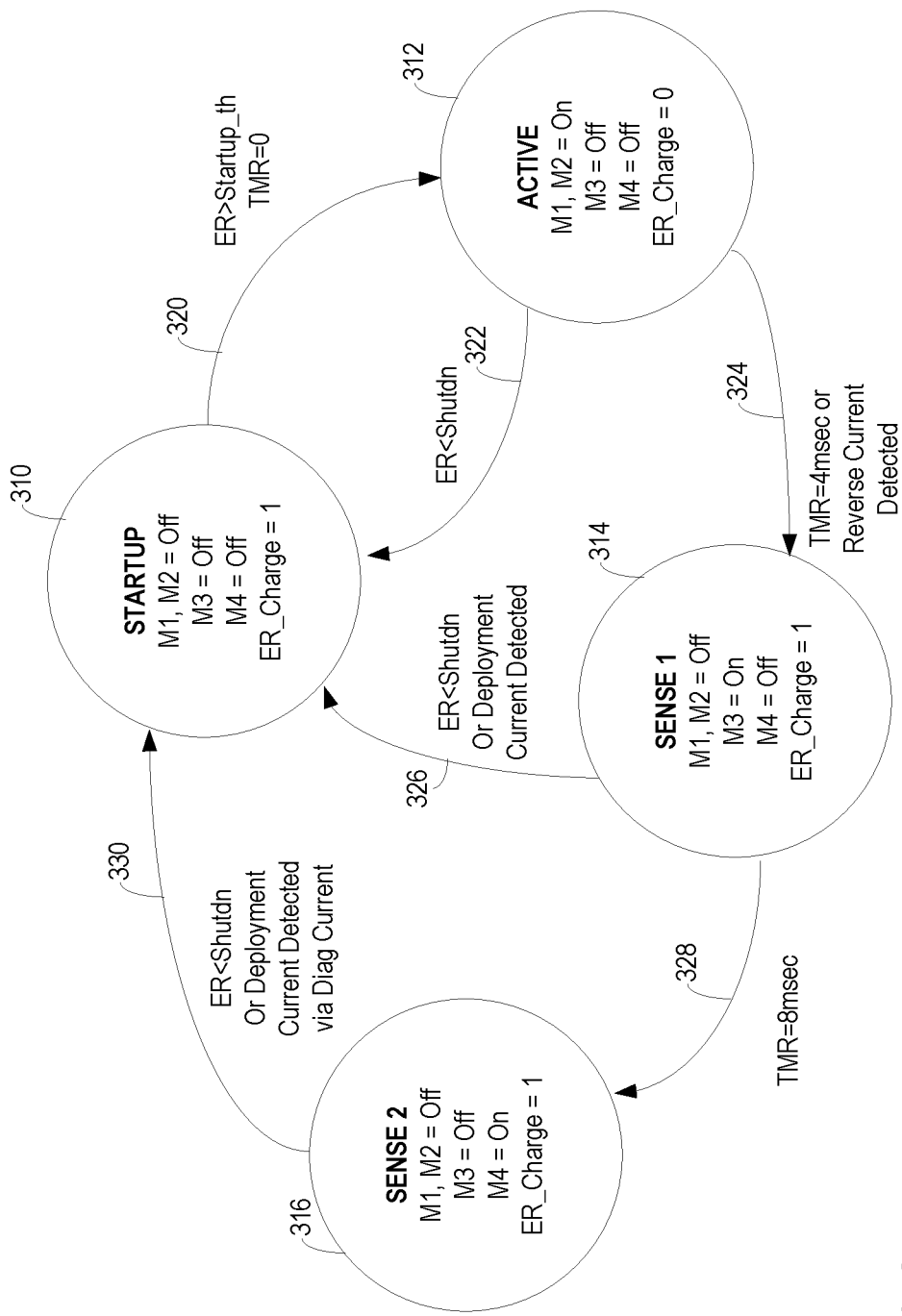
FIG. 3 is a state transition diagram for an integrated duplex deployment restraint module with safety diagnostics.

The above description is a simplified summary of the states, but a more detail explanation is provided with respect to FIG. 3.

FIG. 3 is a state transition diagram for an integrated duplex deployment restraint module with safety diagnostics. When the voltage applied between the Energy Reserve and GND pins (ER) is less than the Shutdown threshold the APBC is in the Startup State. In the Startup State 310 all switches (M1,M2,M3,M3) are in the off state. The APBC is awaiting the application of power where the voltage difference between the Energy Reserve and GND pins (ER) is greater than the Startup Threshold. The Startup threshold guarantees the device is fully operational. Once this applied voltage is achieved and the internal timer (TMR) is set=0, the device enters the Active State as denoted by line 320.

While in Active State 312 the following is possible, 1) Diagnostics function Active or Diagnostic Function Not Active & Deployment is required & TMR>T_Deploy, 2) Diagnostic Function Active or Diagnostic Function Not Active & Deployment is required and TMR<T_Deploy, 3) Diagnostics Function is Active and Opposite Phase APBC requires Deployment or Diagnostic Function.

While in the Active State 312, the switches M1 & M2 are activated to their on state, M3,M4 are in their off state. The Active State 312 will last for a period of 4 msec (3 msec to 5 msec). This time shall support diagnostic and deployment timing requirements. While in Active State 312 the M1 and M2 can support either deployment current or diagnostic current. While in Active State 312 and sufficient time to allow deployment is remaining in TMR normal deployment can occur. While in Active State 312 and not sufficient time to allow deployment is remaining in TMR normal deployment cannot occur, then reactivation of the main switches M1 & M2 can occur by the following: Sense1 State is entered and the main Switches M1 & M2 are disabled and then Deployment Current is detected leading to Startup State and active state transitions to then re-activate M1& M2. The time that M1 & M2 remain in offstate can be as low as three (3) clock transitions (Sense1, Startup, Active State). Also while in Active State 312 and running a Squib Resistance diagnostic, the opposite phase APBC circuit is trying to deploy leads to a reverse current detection that forces this phase APBC into Sense1 State 314 to allow the opposite phase APBC to deploy. In any case, after the TMR achieves 4 msec or reverse current detected in the Active State 312, the device transitions from Active State 312 to Sense1 State 314 as denoted by line 324. Alternatively, if the ER is less than a Shutdn voltage the device transitions to the Startup State 310 as denoted by line 322.

In the Sense1 State 314, M1,M2, M4 are disabled and M3 is enabled. If the current in M3<45 mA then deployment current is not detected meaning that diagnostic mode current is active. In this Sense1 State the Rdson_M3 with additional internal resistance=10 Ohm. This can be detected by the deployment loop ASIC during squib resistance value measurements to validate that Active mode has been disabled. If anytime during Sense1 State 314 the current in M3>=45 mA then deployment current is detected on this APBC ASIC. Then the ASIC state machine will immediately transition from the Sense1 State 314 to the Startup State 326 as denoted by line 326, then to The Active State. The time that M1 & M2 remain in offstate can be as low as two (2) clock transitions from the Sense1 State 314 (Startup, Active State). In any case, after the TMR achieves 4 msec (8 msec total) in the Sense1 State 314, the device transitions from Sense1 State 314 to Sense2 State 316 as denoted by line 328.

In the Sense2 State 316, M1,M2, M3 are disabled and M4 is enabled. If the current in M4<30 mA then deployment current is not detected meaning that diagnostic mode current is inactive. In this Sense2 State 316 the Rdson_M4 with additional internal resistance=100 Ohm. This can be detected by the deployment loop ASIC during squib resistance value measurements (with 8 mA source) to validate that Sense1 State 314 has been disabled. If anytime during Sense2 State 316 the current in M4>=30 mA then deployment current is detected on this APBC ASIC. Then the ASIC state machine will immediately transition from the Sense2 State 316 to the Startup State 310 as denoted by line 330, then to the Active State 312 as denoted by line 320. The time that M1 & M2 remain in offstate can be as low as two (2) clock transitions from the Sense2 State 316 (Startup, Active State). In any case, after the ER, Startup Threshold or Deployment Current Detected in the Sense2 State 316, the device transitions from Sense2 State 316 to Startup State 310 as denoted by line 330.

Figure 4:
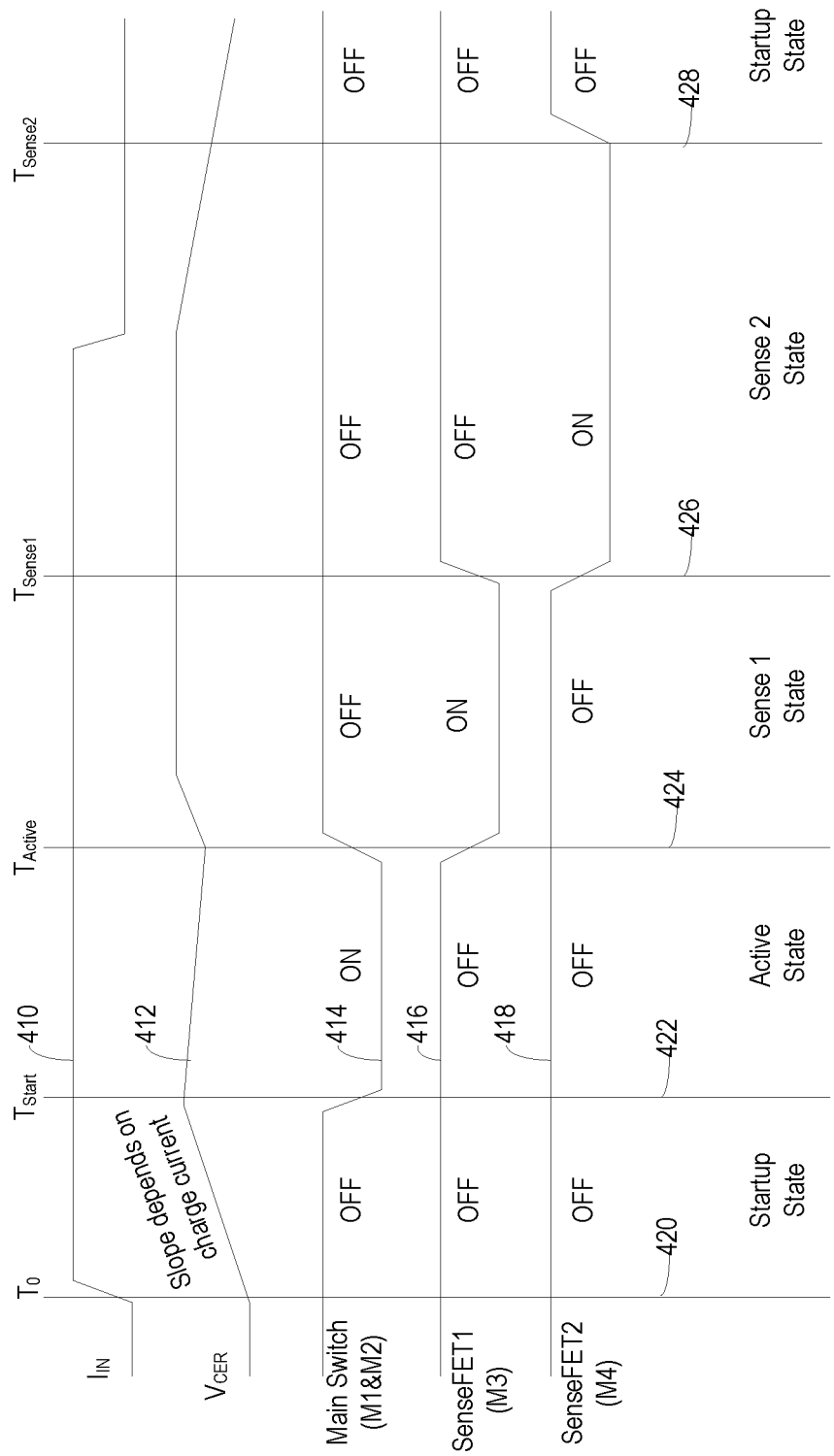
FIG. 4 is a timing diagram for an integrated duplex deployment restraint module with safety diagnostics.

FIG. 4 is a timing diagram for an integrated duplex deployment restraint module with safety diagnostics. The line 410 illustrates the current $I_{IN}$ through a typical state transition cycle. The line 412 illustrates the voltage of $V_{CER}$ across the energy reserve capacitor. The line 414 illustrates the status of the main switch (M1&M2). The line 416 illustrates the status of Sense Switch 1 (M3). The line 418 illustrates the status of Sense Switch 2 (M4). Timing related to each state is illustrated along the X axis for a typical cycle. Time 420 ($T_0$) is the beginning of the cycle and start of the Startup State. Time 422 ($T_{start}$) is the end of the Startup State and the beginning of the Active State. Time 424 ($T_{active}$) is the end of the Active State and the beginning of the Sense1 State. Time 426 ($T_{sense1}$) is the end of the Sense1 State and the beginning of the Sense2 State. Time 428 ($T_{sense2}$) is the end of the Sense2 State and the beginning of the Startup State.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. An active power blocking circuit in series with a squib, the active power blocking circuit comprising:
   a logic circuit;
   a first switch having a first side connected to a positive connection and a second side connected to a negative connection;
   a second switch having a first side connected to the positive connection and a second side connected to the negative connection through a diode; and
   an amplifier connected the second side of the second switch, an output of the amplifier being connected to the logic circuit.

2. The active power blocking circuit of claim 1, wherein the first switch is comprised of a first transistor and a second transistor.

3. The active power blocking circuit of claim 2, wherein the first transistor having a drain connected to the positive connection and a source connected to a source of the second transistor, the drain of the second transistor being connected to the negative connection.

4. The active power blocking circuit of claim 3, wherein the source of the first transistor and the source of the second transistor are connected to the amplifier.

5. The active power blocking circuit of claim 2, wherein the second switch is a third transistor, a drain of the third transistor being connected to the positive connection, a source of the third transistor being connected to the negative connection through the second transistor.

6. The active power blocking circuit of claim 5, wherein a drain of third transistor is connected to the positive connection and a source of the third transistor is connected to a source of the second transistor through a first resistor, the drain of the second transistor being connected to the negative connection.

7. The active power blocking circuit of claim 6, wherein the source of the third transistor is connected to the amplifier through a second resistor.

8. The active power blocking circuit of claim 1, further comprising a reverse sensing amplifier having a negative input connected to squib monitoring connection and a positive input connected to a voltage source.

9. The active power blocking circuit of claim 1, further comprising a third switch having a first side connected to the positive connection and a second side connected to the negative connection through a diode, the second side of the third switch being connected to the amplifier.

10. The active power blocking circuit of claim 1, further comprising a power storage device in communication with the positive connection.

11. The active power blocking circuit of claim 10, wherein the power storage device comprises a capacitor and a diode, an anode of the diode being connected to the positive connection, a cathode of the diode being connected to the capacitor.

12. A duplex restraint module, the duplex restraint module comprising:
   a first squib;
   a first active power blocking circuit in series with the first squib, the first active power blocking circuit comprising a logic circuit, a first switch, a second switch and an amplifier, the first switch having a first side connected to a positive connection and a second side connected to a negative connection, the second switch having a first side connected to the positive connection and a second side connected to the negative connection through a diode, an amplifier connected the second side of the second switch, an output of the amplifier being connected to the logic circuit;

a second squib; and a second active power blocking circuit in series with the second squib, the second active power blocking circuit comprising a logic circuit, a first switch, a second switch and an amplifier, the first switch having a first side connected to a positive connection and a second side connected to a negative connection, the second switch having a first side connected to the positive connection and a second side connected to the negative connection through a diode, an amplifier connected the second side of the second switch, an output of the amplifier being connected to the logic circuit.

13. The duplex restraint module of claim 12, wherein a first side of the first squib is connected to the positive connection of the first active power blocking circuit and a second side of the first squib is connected to the negative connection of the second active blocking circuit.

14. The duplex restraint module of claim 13, wherein a first side of the second squib is connected to the positive connection of the second active power blocking circuit and a second side of the second squib is connected to the negative connection of the first active blocking circuit.

15. The duplex restraint module of claim 14, wherein a capacitor is connected between the second side of the first squib and the second side of the second squib.

16. An active power blocking circuit in series with a squib, the active power blocking circuit comprising:

a logic circuit having an active state and a first sensing state;

a first switch having a first side connected to a positive connection and a second side connected to a negative connection, the first switch conducting in the active state;

a second switch having a first side connected to the positive connection and a second side connected to the negative connection through a diode, the second switch conducting in the first sensing state; and an amplifier connected the second side of the second switch, an output of the amplifier being connected to the logic circuit.

17. The active power blocking circuit of claim 16, wherein logic circuit is configured to measure the output of the amplifier in the first sensing state.

18. The active power blocking circuit of claim 16, further comprising a third switch having a first side connected to the positive connection and a second side connected to the negative connection through the diode, the third switch conducting in a second sensing state of the logic circuit.

19. The active power blocking circuit of claim 18, wherein the logic circuit is configured to measure the output of the amplifier in the first sensing state.

20. The active power blocking circuit of claim 16, wherein the logic circuit is configured to transition from the active state to the first sensing state based on a timer.

21. An active power blocking circuit in series with a squib, the active power blocking circuit comprising:

a logic circuit;

a first switch having a first side connected to a positive connection and a second side connected to a negative connection;

a second switch having a first side connected to the positive connection and a second side connected to the negative connection through a diode; and a third switch having a first side connected to the positive connection and a second side connected to the negative connection through a diode;

a first amplifier having a positive input connected to the second side of the third switch and a negative input connected to an internal reference voltage, and an output of the first amplifier being connected to the logic circuit; and a second amplifier having a negative input connected a squib monitoring input and a positive input connected to an internal reference voltage, and an output of the second amplifier being connected to the logic circuit.

* * * * *